United States Patent [19]

Sato

[11] Patent Number: 4,768,080

[45] Date of Patent: Aug. 30, 1988

[54] SEMICONDUCTOR DEVICE HAVING FLOATING AND CONTROL GATES

[75] Inventor: Masaki Sato, Kawasaki, Japan

[73] Assignee: Kabushiki Kaisha Toshiba, Kawasaki, Japan

[21] Appl. No.: 805,628

[22] Filed: Dec. 6, 1985

[30] Foreign Application Priority Data

Dec. 7, 1984 [JP] Japan .................. 59-258515

[51] Int. Cl.⁴ .............. H01L 29/78; H01L 29/34; H01L 29/04
[52] U.S. Cl. .................. 357/54; 357/23.5; 357/23.9; 357/59; 365/185
[58] Field of Search .......... 357/23.5, 54, 59, 23.9; 365/185

[56] References Cited

U.S. PATENT DOCUMENTS

| | | | |
|---|---|---|---|
| 4,115,914 | 9/1978 | Harasi | 357/23.5 |
| 4,282,540 | 8/1981 | Ning et al. | 357/23.5 |
| 4,334,347 | 6/1982 | Goldsmith et al. | 357/23.5 |
| 4,455,568 | 6/1984 | Shiota | 357/23.5 |
| 4,488,931 | 12/1984 | Pansana | 357/23.5 |
| 4,532,535 | 7/1985 | Gerber et al. | 357/23.5 |

FOREIGN PATENT DOCUMENTS

0144900 6/1985 European Pat. Off. .
55-166962 12/1980 Japan .
56-26472 3/1981 Japan .
56-134775 10/1981 Japan .
58-186 1/1983 Japan .
58-87877 5/1983 Japan .
59-105371 6/1984 Japan .

OTHER PUBLICATIONS

T. C. Penn, "New Methods of Processing Silicon Slices,", *Science*, vol. 208, (1980), pp. 923–926.

S. Mori et al., "Poly-Oxide/Nitride/Oxide Structures for Highly Reliable EPROM Cells," *1984 Symposium on VLSI Technological Digest of Technical Papers*, San Diego, (Sep. 1984), pp. 40–41.

M. Kikuchi et al., "A New Technique to Minimize the EPROM Cell", *1978 IEEE Int'l Electron Devices Mtg., Technical Digest*, pp. 181–184.

*Primary Examiner*—J. Carroll
*Attorney, Agent, or Firm*—Finnegan, Henderson, Farabow, Garrett & Dunner

[57] ABSTRACT

A semiconductor device such as a MOS transistor includes floating and control gates. Between the gates is provided a composite insulating layer including a silicon nitride layer. The end portions of the composite insulating layer extend in the channel-length direction of the MOS transistor beyond the end portions of at least one of the floating and control gates.

7 Claims, 8 Drawing Sheets

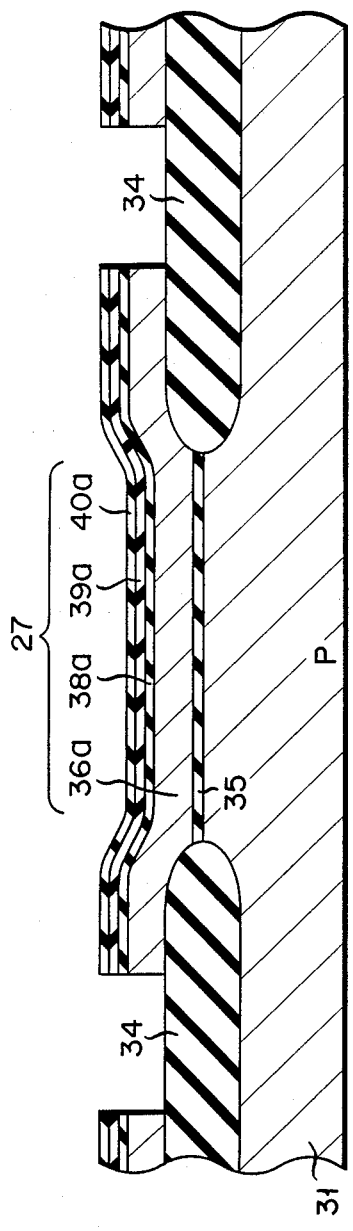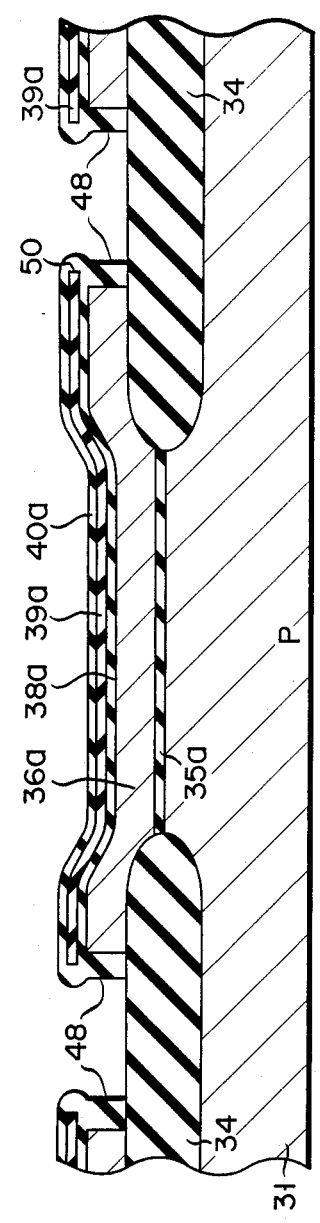

SEMICONDUCTOR DEVICE HAVING FLOATING AND CONTROL GATES

BACKGROUND OF THE INVENTION

This invention relates to a semiconductor device having a floating gate and control gate and a method for manufacturing the same.

A semiconductor device having a floating gate and control gate, for example, a MOS transistor can externally detect the level of a threshold voltage and thus be used as a memory element of a memory device.

The structure of a conventional MOS transistor with the above-mentioned double gates will be explained below with reference to FIGS. 1A and 1B. FIG. 1A is a cross sectional view as taken along a channel-length direction of a prior art semiconductor device and a cross sectional view as taken along a channel-width direction of FIG. 1A. In the arrangement shown in FIGS. 1A and 1B, n-type source and drain regions 12 and 13 are formed in the surface portions of a p-type semiconductor substrate 11, and a channel region 14 is formed between the source region and the drain region. An insulating layer (a gate insulating layer) is formed on the channel region 14. A floating gate 16 of a polysilicon is formed on the insulating layer 15. Then, an insulating layer 17 is formed on the floating gate 16 and a control gate 18 is formed on the insulating layer 17. A silicon dioxide ($SiO_2$) layer 19 covers the whole surface of the above-mentioned MOS transistor. As shown in FIG. 1B, the MOS transistor area is isolated by a field insulating layer 20 from the other MOS transistor area.

In the above-mentioned MOS transistor the floating gate 16 is "electrically floated". A strong electric field is induced through the utilization of a coupling capacity present between the control gate 18 and the floating gate 16. As a result, a Fowler Noldheim type tunnel current flows through the layer 17 and charges are selectively injected into the floating gate 16, whereby data can be written into the MOS transistor. Upon applying a voltage between the source and the drain a channel current flows, producing hot electrons in the neighborhood of the drain 13. The hot electrons are injected into the floating gate 16, causing a rise in the threshold voltage of the MOS transistor whereby it is possible to write data in the MOS transistor, i.e., to permit a programming. Since the charges injected into the floating gate 16 continue to be held in the floating gate 16 unless a reprogramming is performed, the data once programmed is nonvolatilely held in the MOS transistor. The above-mentioned MOS transistor formed in a memory device is referred to, as required, as a memory cell.

In the memory device a situation must be avoided that charges are injected into a cell with respect to which a read/write operation is carried out or that the charges so injected flow out. As understood from the above, there is a risk that, with such a cell in that state, erroneous data will be read out of the memory device. For an enhanced integration density and microminiaturization of the memory device, insulating layers are made thinner and thinner and the temperature in the manufacturing process is made lower and lower. Therefore, there is a tendency that erroneous charges are injected or discharged more often in the memory cell. The floating gate 16 is usually formed of a polysilicon and isolated from the control gate 18 by a silicon dioxide ($SiO_2$) layer 17 which is thermally formed on the surface of the floating gate 16. Due to the adoption of the lower oxidation temperature and formation of thinner and thinner $SiO_2$ layers, an uneven surface is formed for the $SiO_2$ layer, causing charges to be liable to concentrate locally and thus a leakage current to be liable to be produced across the gates 16 and 18.

In order to eliminate the above-mentioned drawbacks, the inventor has developed memory cells as shown in FIGS. 2A and 2B. The memory cell was disclosed in "1984 Symposium on VLSI Technology Digest of Technical Papers" p. 40 to 42, entitled "Poly-Oxide/Nitride/Oxide Structures for Highly Reliable EPROM Cells". This outline will be explained below with reference to FIGS. 2A (a cross sectional view as taken along a channel-length direction of a prior art semiconductor device) and 2B (a cross sectional view as taken in a channel-width direction of FIG. 2A). A composite insulating layer 24 is formed, as shown in FIGS. 2A and 2B, between a floating gate 16 and a control gate 18. The composite insulating layer 24 includes an $SiO_2$ layer 21 formed by the thermal oxidation of the floating gate 16 of a polysilicon, a silicon nitride layer 22 formed on the layer 21 and an $SiO_2$ layer 23 formed by the thermal oxidation of the surface of the layer 22. It has been found that this memory cell can reduce such leakage current to a greater extent than that in the memory cell of FIGS. 1A and 1B. However, it has been observed that, if the temperature of the manufacturing process is further reduced in the arrangement shown in FIGS. 2A and 2B, a larger leakage current is produced at an X point in FIG. 2A. Here, the X point shows the end portions of the composite layer 24 in the channel-length direction and the Y point shows the end portions of the composite layer 24 in the channel-width direction.

The enhanced integration density and the larger size of the silicon wafer are essential requirements under which it is possible to implement an inexpensive integrated circuit of an enhanced function. In order to satisfy these essential requirements it is unavoidable to adopt a low-temperature manufacturing process in which case the above-mentioned leakage current should be made as low as possible.

SUMMARY OF THE INVENTION

An object of this invention is to provide a semiconductor device which can sufficiently suppress a leakage current as produced across a floating gate and a control gate.

Another object of this invention is to provide a method for manufacturing a semiconductor device, which can sufficiently suppress a leakage current as produced across a floating gate and a control gate.

A semiconductor device according to this invention comprises source and drain regions between which a channel region is formed, a gate insulating layer provided on the channel region, a floating gate provided on the gate insulating layer, a composite insulating layer provided on the floating gate and including a plurality of insulating layers which are different from one another in their properties, and a control gate provided on the composite insulating layer. The end portions of the composite insulating layer extend in the channel-length direction of the channel region beyond the end portions of at least one of the floating and control gates.

A method of manufacturing a semiconductor device according to this invention, in which the semiconductor device comprises source and drain regions between which a channel region is formed, a gate insulating layer provided on the channel region, a floating gate provided on the gate insulating layer, a composite insulating layer provided on the floating gate and including a plurality of insulating layers which are different from one another in their properties, and a control gate provided on the composite insulating layer, the method comprising the steps of selecting first and second regions in a semiconductor substrate of first conductivity type, the source and drain regions being formed in the first and second regions; forming a field insulating layer surrounding an active region including the first and second regions; forming a first SiO$_2$ layer covering the active region; forming a first polysilicon layer covering the first SiO$_2$ layer and the field insulating layer; patterning the first polysilicon layer so as to have a width corresponding to the width of the floating gate, the width being the length in the channel-width direction; forming a multilayered insulating layer on the first polysilicon layer from which the composite insulating layer is formed; forming a second polysilicon layer on the multilayered insulating layer; forming a resist pattern on the second polysilicon layer, the resist pattern having a length corresponding to that of the composite insulating layer, the length being the length in the channel-length direction; effecting an etching, using the resist pattern as a mask, for forming the control gate, composite insulating layer and floating gate; shortening the lengths of the control and floating gates; and doping an impurity of second conductivity type into the first and second regions for forming the drain and source regions.

BRIEF DESCRIPTION OF THE DRAWINGS

FIGS. 6A to 6C are cross sectional views in the channel-width direction, respectively, of a semiconductor device according to another embodiment of this invention, for explaining the manufacturing steps.

DETAILED DESCRIPTION OF THE PREFERRED EMBODIMENTS

The steps of manufacturing the embodiment of this invention will be explained below with reference to FIGS. 3A to 3E, 4A to 4E and 5A and 5B.

The semiconductor device according to the embodiment of this invention is constructed of a memory cell, a plurality of such memory cells constituting an EPROM (erasable programmable read only memory). FIGS. 3A to 3E correspond to FIGS. 4A to 4E, respectively.

In these Figures a p-type silicon semiconductor substrate 31 has a [100] crystalline surface and a resistivity of 20 Ω·cm. A thermal oxidation SiO$_2$ (silicon dioxide) layer 32 is formed on the semiconductor substrate 31 and then a silicon nitride layer 33 is formed on the SiO$_2$ layer 32 by LPCVD (low pressure chemical vapor deposition) method. The silicon nitride layer 33 and the SiO$_2$ layer 32 are patterned by photolithgraphy to remain on an active regrion which includes source, drain and channel formation regions. An impurity for channel stop, such as boron, is ion implanted in the region excluding the active region by an ordinary MOS transistor manufacturing method. Then, a field SiO$_2$ layer 34 of about 1 μm in thickness is formed by a selective oxidation (see FIGS. 3A, 4A).

Figure 3A:
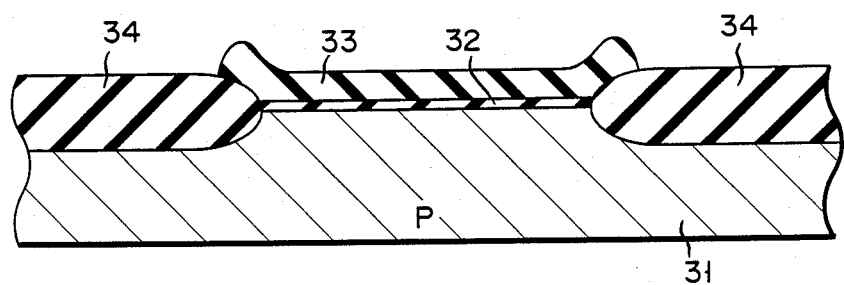
FIGS. 3A to 3E are cross sectional views, respectively, in the channel-width-direction of a semiconductor device according to one embodiment of this invention, for explaining the manufacturing steps.
Figure 3B:
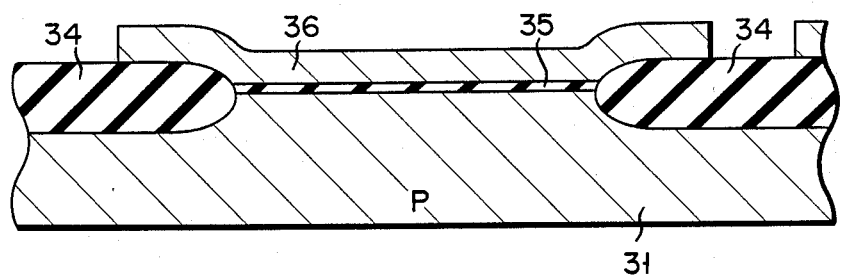
Figure 4A:
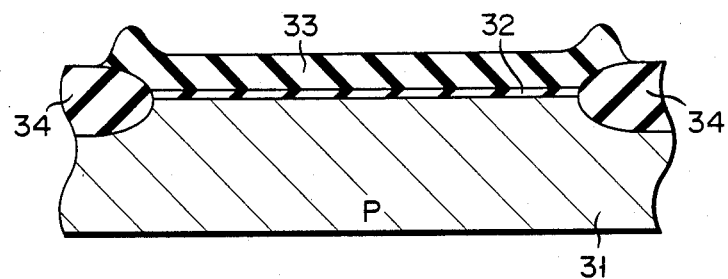
FIGS. 4A to 4E are cross sectional views, respectively, in the channel-length direction corresponding to FIGS. 3A to 3E.
Figure 4B:
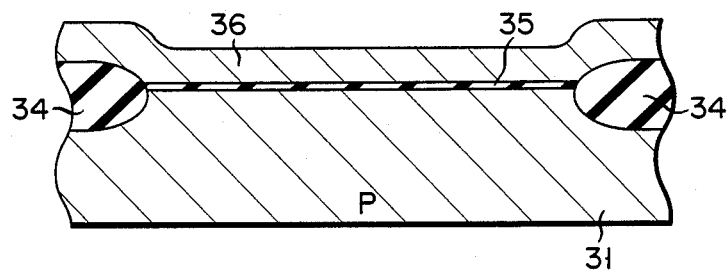

After the silicon nitride layer 33 and thermal oxidation SiO$_2$ layer 32 have been removed, an SiO$_2$ layer 35 of about 200 Å in thickness is grown, as shown in FIGS. 3B and 4B, on that surface of a semiconductor substrate 31 as defined within an active region. Then, boron is ion implanted, as an impurity, in the active region at 70 KeV with a concentration of $3 \times 10^{12}$ cm$^{-2}$ to permit the control of a threshold voltage on a MOS transistor (or cell). A first polysilicon layer 36 of about 4,000 Å in thickness is deposited by the LPCVD (low pressure chemical vapor deposition) method on the surface of the resultant structure including the SiO$_2$ layer 35 and field SiO$_2$ layer 34. Then, phosphorus is doped at a density of $3 \times 10^{20}$ cm$^{-3}$ into the polysilicon layer 36. It is preferable that as the doping method the ordinary phosphorus diffusion using POCl$_3$ gas be carried out for about 20 minutes at 950° C. However, it may be possible to implant phosphorus ions. Isolated polysilicon layers are formed by patterning the first polysilicon layer 36. That is, in order to separate the floating gates in the adjacent cells from each other at last, the first polysilicon layer 36 is subjected to a patterning step by photolithography to leave those portions of the first polysilicon layer 36 corresponding to the first polysilicon layer 36 as indicated by hatched lines in FIG. 5. In this connection it is noted that reference numeral 37 shows a region isolated by the field SiO$_2$ layer 34 and corresponding to the above-mentioned active region. The first polysilicon layer 36 as shown in FIG. 3B corresponds in width to the floating gate as viewed in the channel-width direction (see FIGS. 3B and 4B).

Figure 3C:
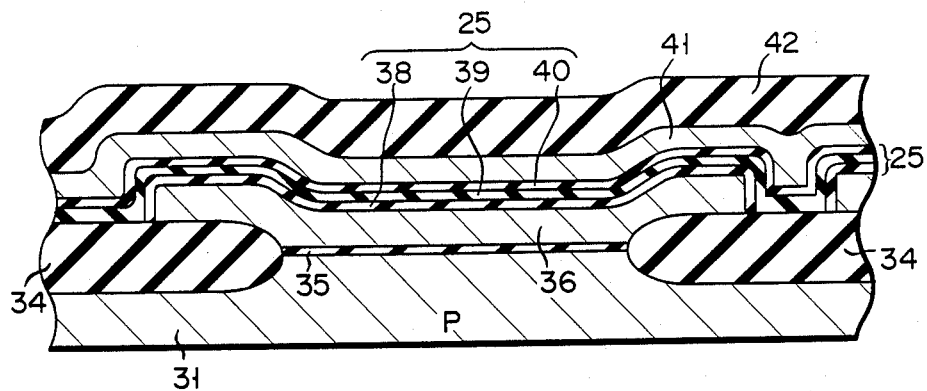
Figure 4C:
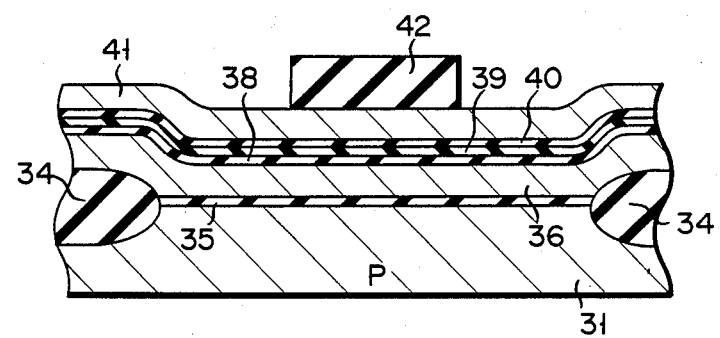
Figure 4D:
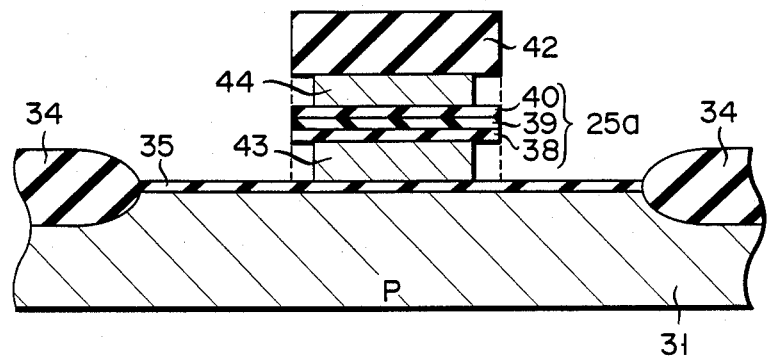

Then, a second SiO$_2$ layer 38 of about 300 Å in thickness is formed on the polysilicon layer 36, as shown in FIGS. 3C and 4C. A silicon nitride layer 39 of about 150 Å in thickness is formed on the second SiO$_2$ layer by the LPCVD method and a third SiO$_2$ layer 40 of about 60 Å in thickness is formed on the silicon nitride layer 39. The third SiO$_2$ layer 40 can be formed either by the CVD method or by oxidizing the silicon nitride layer 39 at 950° C. These layers 38, 39 and 40 constitute a multilayered insulating layer 25 and a composite insulating layer 25a as explained later with reference to FIG. 4D is formed from the multilayered insulating layer 25. A second polysilicon layer 41 is formed on the third SiO$_2$ layer 40 and a phosphorus is doped as an impurity into the second polysilicon layer 41 at a density of $5 \times 10^{20}$ cm$^{-3}$. A resist pattern 42 is formed on the second polysilicon layer 41. It is to be noted that the length of the resist pattern 42 (the length of the pattern 42 in the channel-length direction shown in FIGS. 4C and 4D)

corresponds to the length of the composite insulating layer 25a in FIG. 4D (the length of the layer 25a in the channel-length direction) (see FIGS. 3C and 4C).

Figure 3D:
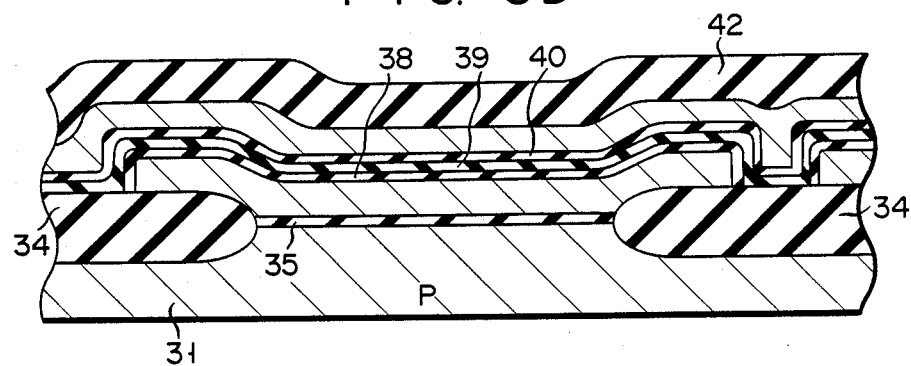
Figure 5A:
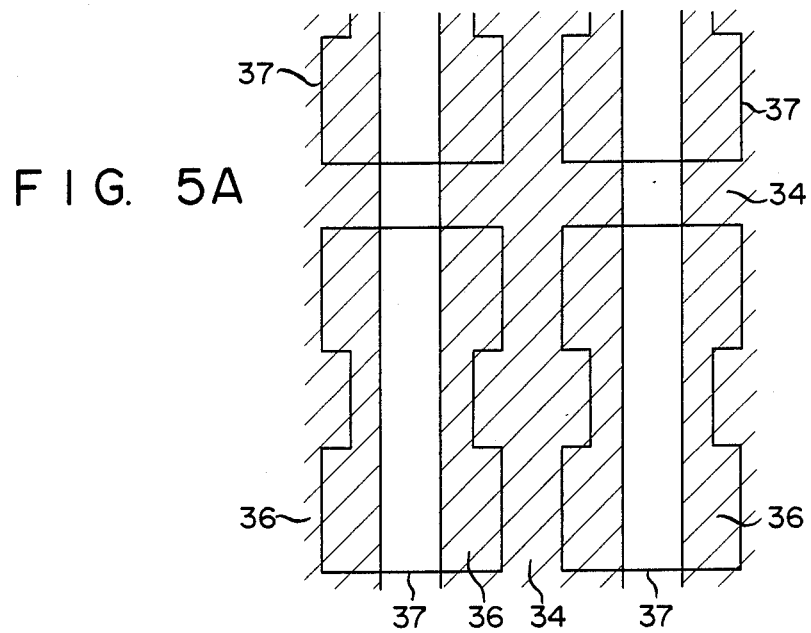
FIGS. 5A and 5B are top views respectively corresponding to FIGS. 3A to 3E and FIGS. 4A to 4E.
Figure 5B:
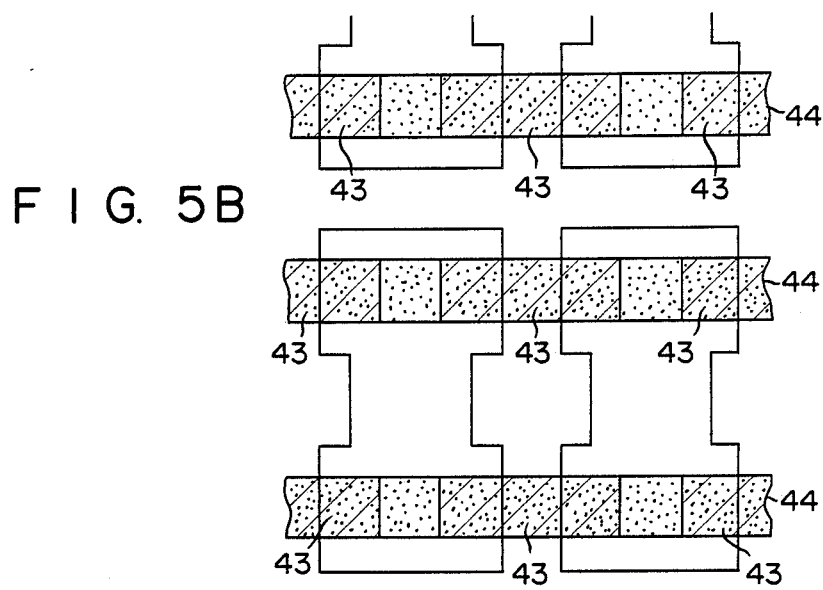

Then, as shown in FIGS. 3D and 4D an anisotropic etching step such as RIE (Reactive Ion Etching) is performed with the resist pattern 42 as a mask, followed by an isotropic etching step. First, the anisotropic etching of the second polysilicon layer 41 is selectively carried out. At this time a gas containing $CCl_4$ can be used as an etchant gas. With the resist pattern 42 as a mask the layers 40, 39 and 38 are sequentially etched in a selective fashion, using a $CF_4$ gas as a chief etchant. Then, with the resist pattern as a mask, the first polysilicon layer 36 is etched selectively, using a gas containing $CCl_4$ as an etchant. As a result, the first polysilicon layer 36 is such that only its portion as indicated by hatched lines in FIG. 5B is left as a floating gate 43. Similarly, the second polysilicon layer 41 is such that only its portion as indicated in dotted patterns in FIG. 5B is left as a control gate 44. In this Figure, it is to be noted that the lengths of the floating gate 43 and control gate 44 as viewed in the channel-length direction are indicated by a dotted line in FIG. 4D. In the above-mentioned isotropic etching step, with the resist pattern 42 as a mask, the ends of the floating gate 43 and control gate 44 in the channel-length direction are etched in a gas containing $(CF_4+O_2)$ gas as a main etchant to permit these ends to be recessed to an extent of about 500 Å as shown in FIG. 4D. Stated in more detail, in the arrangement shown in FIG. 4D the composite insulating layer 25a is not etched in the isotropic etching step with only the floating and control gates etched. In consequence, as shown in FIG. 4D, the ends of the composite insulating layer 25a as viewed in the channel-length direction provide a projecting structure with respect to the recessed ends of the floating and control gates.

Figure 3E:
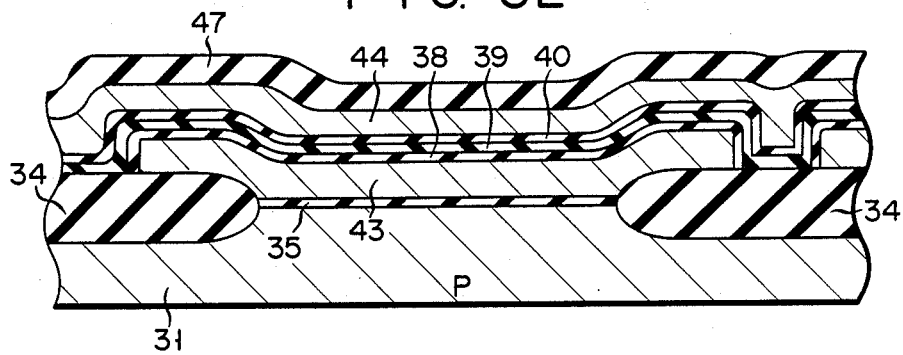

Then, the resist pattern 42 is removed and arsenic ions are implanted into the substrate 31 at 40 KeV with a concentration of $2\times10^{15}$ cm$^{-2}$, causing a diffusion to occur to permit n-type source and drain regions to be formed in the substrate. An $SiO_2$ layer 47 is deposited on the whole surface of the cell in an $O_2$ atmosphere at 950° C. (FIGS. 3E and 4E).

Figure 4E:
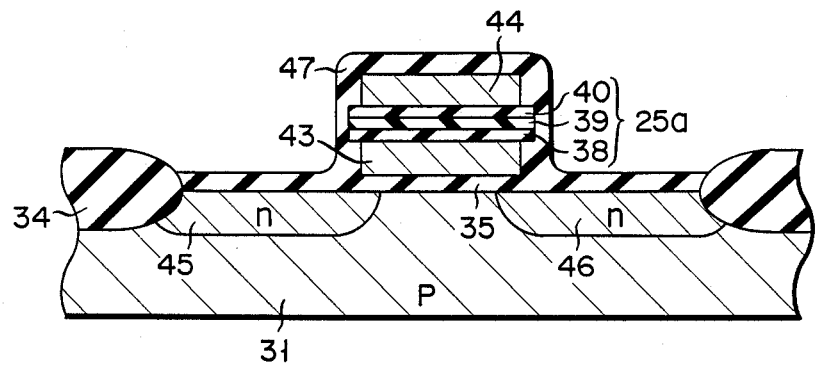

Then, as in the manufacture of an ordinary MOS transistor an $SiO_2$ layer of 5,000 Å in thickness is formed by the CVD method on the whole surface of the cell as shown in FIG. 4E (not shown), and PSG (PhosphoSilicate Glass) is deposited, with a thickness of 7,000 Å, on the whole surface of the cell as shown in FIG. 4E, followed by an annealing step for 30 minutes at 950° C. The formation of contact holes and, for example, aluminum interconnections are performed, thereby completing an EPROM.

Instead of the above mentioned isotropic etching step, thermal oxidation step for the floating and control gates may be employed. In other words, the floating and control gates 43 and 44 can be shortened in their lengths in the channel-length, direction as shown in FIG. 4D, by being subjected to thermal oxidation.

Figure 2A:
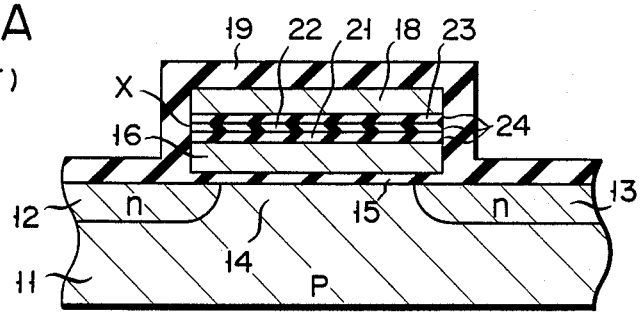
FIG. 2A is a cross sectional view in the channel-length direction of another prior art semiconductor device.
Figure 2B:
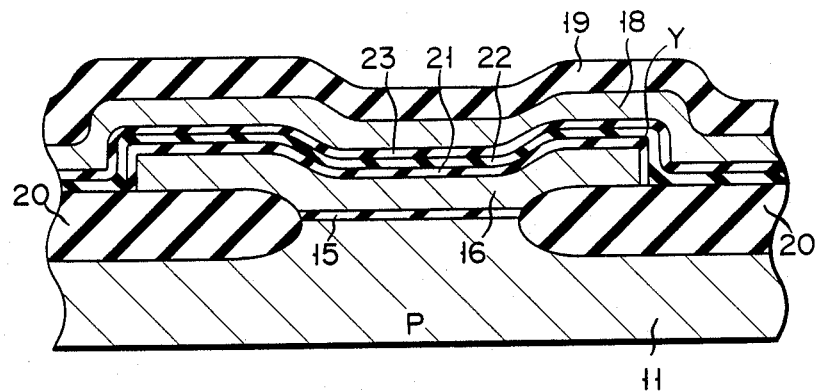
FIG. 2B is a cross sectional view in the channel-width direction corresponding to FIG. 2A.

The semiconductor device according to the embodiment of this invention has the following advantages. Since the ends of the silicon nitride layer 39 in the composite insulating layer 25a, as viewed in the channel-length direction, provide the projecting structure in the channel-length direction with respect to the recessed ends of the floating gate 43, a path of leakage current leading from the floating gate 43 to the control gate 44 is longer than the leakage current path shown in FIG. 2A. The silicon nitride layer 39 is relatively high in dielectric constant in comparison with the $SiO_2$ layer and thus the intensity of the electric field in the silicon nitride layer is relatively small as compared with that in the $SiO_2$ layer. This means that owing to the presence of the silicon nitride layer a distance between the floating gate 43 and the control gate 44 becomes effectively longer. In the above-mentioned embodiment the suppression of the leakage current at the above-mentioned edge portions X, Y has been explained as being important in connection with FIGS. 2A and 2B. In the above-mentioned embodiment, the ends of the silicon nitride layer 39 extends beyond the ends of the floating gate electrode in the channel-length direction, the concentration of the electric field at the above-mentioned ends or edge portions X becomes lower, thus enabling the generation of the leakage current to be suppressed down to a much lower extent. Upon comparison between FIGS. 2A and 4E the leakage current can be suppressed due to the presence of the silicon nitride layers 22 (FIG. 2A) and 39 (FIG. 4E), provided that the above-mentioned edge portions are disregarded. In FIG. 2A, however, only the insulating layer 19 exists between the floating gate 16 and the control gate 18 at the edge portion X, failing to enhance an insulating effect between the gates. In consequence, the leakage current of the device as shown in FIG. 2A becomes remarkably greater than the leakage current of the device shown in FIG. 4E. Supposing the total edge lengths of the floating gates as shown in FIG. 5B to be equal to each other, it has been possible to suppress the leakage current of FIG. 4E down to one tenth to one hundredth that of FIG. 2A.

Figure 6C:
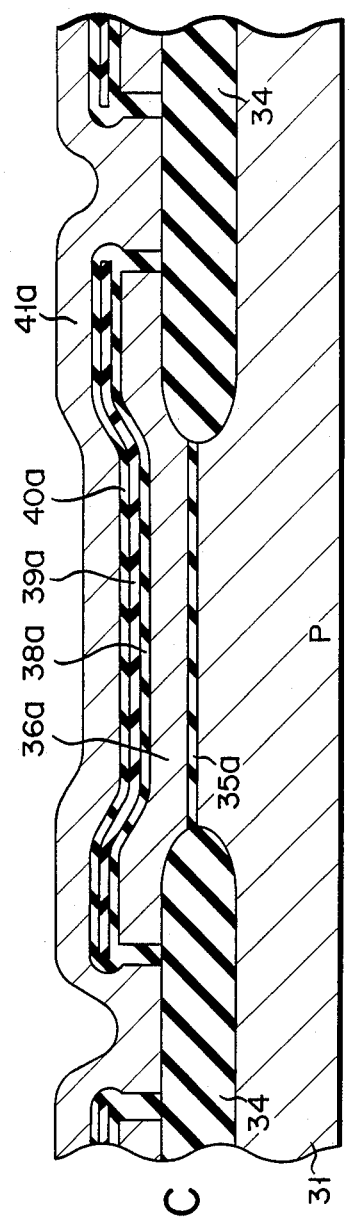

A semiconductor device according to another embodiment of this invention will be explained below with reference to FIGS. 6A to 6C. In the embodiment of FIGS. 3A to 3E and 4A to 4E the ends of the composite insulating layer 25a in the channel-length direction has been explained as extending beyond the ends of the floating gate 43 and control gate 44 in the channel-length direction. Furthermore, as shown in FIG. 3E, the silicon nitride layer 39 has been explained as being shared between the adjacent cells in the channel-width direction. In the other embodiments of this invention, as shown in FIG. 6C, a silicon nitride layer 39a of one cell is separated from that of another cell, and the ends of the silicon nitride layer 39a in the channel-width direction extend beyond the ends of the first polysilicon layer 36a in the channel-width direction, that is, beyond the ends of a floating gate in the channel-width direction. The method of manufacturing these embodiments will be explained below.

The above-mentioned steps as shown in FIG. 3A can be applied to said other embodiments. That is, a thermal oxidation $SiO_2$ layer 32 is formed on a silicon semiconductor substrate 31 and a silicon nitride layer 33 is deposited by the LPCVD method on the layer 32. Then, an active region is patterned by photolithography. A channel stop impurity, such as boron, is ion implanted into the region other than the active region by using an ordinary MOS transistor fabrication method. Then, a field $SiO_2$ layer 34 of 1 μm in thickness is formed by the selective oxidation method.

After the removal of the above-mentioned silicon nitride layer 33 and $SiO_2$ layer 32, an $SiO_2$ layer 35a of about 200 Å in thickness is formed on the surface of the substrate 31. In order to control the threshold voltage of the cell, boron is ion implanted into the active region at 70 KeV with a concentration of $3 \times 10^{12}$ cm$^{-2}$.

A first polysilicon layer 36a of about 4,000 Å in thickness is formed by the LPCVD method on the whole surface of the resultant structure including the active region and phosphorus is doped in a first polysilicon layer 36a, with a concentration of $3 \times 10^{20}$ cm$^{-3}$, and a second SiO$_2$ layer of about 200 Å in thickness is formed on the surface of the first polysilicon layer 36a. At this time it is preferable that the oxidation temperature is selected to be below 950° C. so as to prevent boron ions previously implanted into the channel region from thermally diffused, to make the impurity concentration at the surface portion of the channel region low, and to make the impurity concentration in an inner portion of the channel region high. The reason is that it is possible to prevent a short channel effect which is otherwise liable to occur when the cell is microminiaturized and further more it is possible to elevate the efficiency with which hot electrons are produced in the channel region. Then, a silicon nitride layer 39a of about 150 Å in thickness is formed by the CVD method on the second SiO$_2$ layer 38a, and a third SiO$_2$ layer 40a of about 60 Å in thickness is formed on the surface of the layer 39a. Then, as explained in FIG. 5A, in order to separate the first polysilicon layer 36a from an adjacent cell in the channel-width direction, predetermined portions of a laminated layer 27 including the third SiO$_2$ layer 40a, silicon nitride layer 39a, second SiO$_2$ layer 38a and first polysilicon layer 36a are selectively removed. In this case, the removed area includes that portion of the laminated layer 27 which is located on a peripheral circuit formation area, not shown, where cells are not formed. These steps are indicated in a sectional view in FIG. 6A.

After the surface of the substrate 31 has been washed an cleaned, an SiO$_2$ layer (not shown) of about 300 Å in thickness is deposited on the peripheral circuit formation area at a temperature of about 900° C. That SiO$_2$ layer, not shown, formed at this step is used as a gate insulating layer for transistors of which the peripheral circuit is comprised. This SiO$_2$ layer, not shown, is also formed on the exposed surface of the cell. Since the SiO$_2$ layer is formed by a low-temperature growth step, a higher growth speed is involved at the exposed surface portions of the first polysilicon layer 36a, i.e., at those surface portions exposed by the separation of the layer 36a. For this reason, an SiO$_2$ layer 48 of about 800 Å in thickness is formed on the end surfaces of the layer 36a in the channel-width direction. When a growth rate of SiO$_2$ on the polysilicon surface is increased, the ends of the silicon nitride layer 39a overhang beyond the ends of the layer 36a. These steps are indicated in a cross sectional view in FIG. 6B.

A second polysilicon layer 41a for a control gate formation is deposited on the entire surface of the resultant structure. Thereafter, a resist pattern 42 is formed on the silicon layer 41a as explained with respect to FIG. 4C. As explained with reference to FIG. 4D, the second polysilicon layer 41a, third SiO$_2$ layer 40a, silicon nitride layer 39a, second SiO$_2$ layer 38a and first polysilicon layer 36a are selectively etched by the anisotropic etching method in a sequential fashion. Only the second polysilicon layer 41a and first polysilicon layer 36a are etched by the isotropic etching method by an extent of about 500 Å. A relation of the composite insulating layer 25a to the floating gate 43 and control gate 44 is as shown in FIG. 4D.

Then, the second polysilicon layer at the peripheral circuit formation area is selectively removed by the photolithography and an n-type impurity doping step is performed to form source and drain regions 45 and 46 in the substrate (see FIG. 4E). The following steps have already been explained with reference to FIG. 4E and, thus, further explanation is omitted.

In the above-mentioned embodiment, it is possible to prevent the electric field from being concentrated toward the edges of the floating gate (FIG. 4E) both in the channel-length direction and in the channel-width direction, permitting a leakage current to be further suppressed. Since in the above-mentioned embodiment the thickness of the gate insulating layer for transistors in the peripheral circuit formation area and that of the gate insulating layer for cells can be independently set with a greater freedom of design. Furthermore, the adoption of the low-temperature process permits the microminiaturization of cells as well as an improvement in the write-characteristics of cells.

Figure 1A:
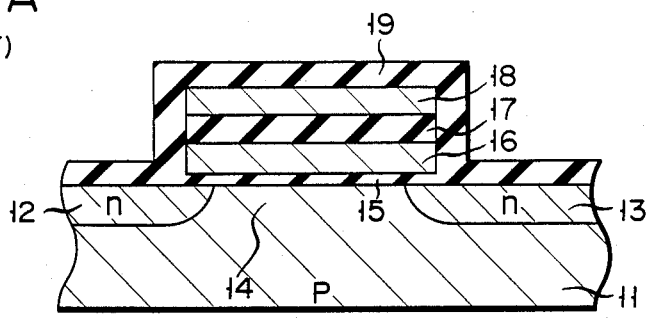
FIG. 1A is a cross sectional view in the channel-length direction of a prior art semiconductor device.
Figure 1B:
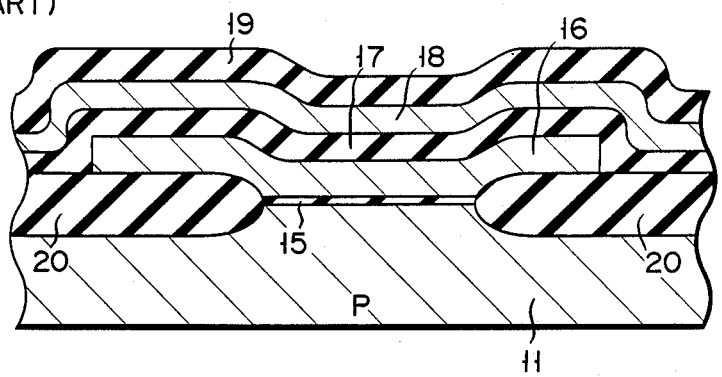
FIG. 1B is a cross sectional view in the channel-width direction corresponding to FIG. 1A.
Figure 7:
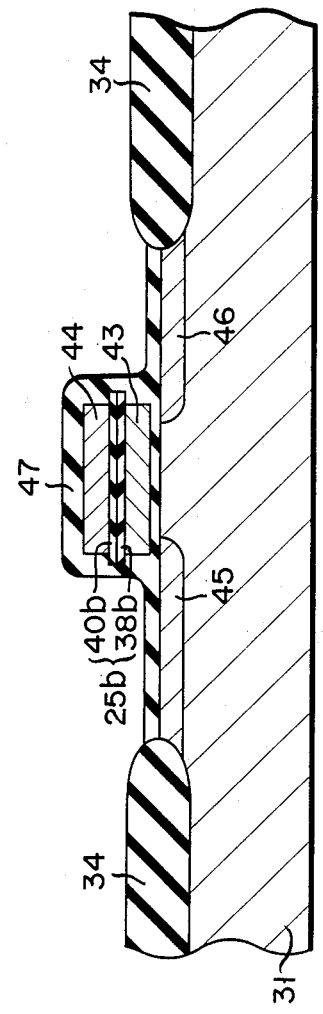
FIG. 7 is a cross sectional view in the channel-length direction of still another embodiment of this invention.

This invention is not restricted to the above-mentioned embodiments. For example, the SiO$_2$ layer formed by the CVD method in which tetraethoxysilane (TEOS) is used for reactant can be used instead of the silicon nitride layer 39 or 39a. FIG. 7 shows a sectional view of such an embodiment as viewed in the channel-width direction. In FIG. 7 the composite insulating layer 25b includes a CVD SiO$_2$ layer 40b and an SiO$_2$ layer 38b formed by thermally oxidizing the surface of the floating gate 43 and a CVD SiO$_2$ layer 40b. The insulating layer 17 in FIG. 1A is the SiO$_2$ layer thermally grown on the polysilicon layer, resulting in a poor withstand-voltage characteristics. In consequence, the SiO$_2$ layer 40b is excellent in current-voltage characteristics over the SiO$_2$ layer 38b and, in addition, the ends of the layer 40b extend beyond the ends of the floating gate 43 in the channel-length direction, offering a greater advantage of suppressing the leakage current. The method for manufacturing a semiconductor device of this embodiment can readily be reduced to practice by modifying the portion or portions of the arrangement of FIGS. 3A to 3E and 4A to 4E.

What is claimed is:

1. A semiconductor device comprising: source and drain regions between which a channel region is formed, a gate insulating layer provided on said channel region, a floating gate provided on said gate insulating layer, a composite insulating layer provided on said floating gate and including a plurality of insulating layers which are different from one another in their properties, and a control gate provided on said composite insulating layer, wherein said floating gate, said control gate, and said composite insulating layer are self-aligned by etching using a single mask, wherein the widths of said floating and said control gates are substantially the same in the length direction of said channel region, and wherein the end portions of said composite insulating layer extend in the length direction of said channel region beyond the end portions of said floating and control gates.

2. A semiconductor device according to claim 1, wherein said composite insulating layer includes a silicon nitride layer.

3. A semiconductor device according to claim 1, wherein said composite insulating layer includes an SiO$_2$ layer formed by a chemical vapor deposition method.

4. A semiconductor device according to claim 1, wherein said composite insulating layer comprises a silicon nitride layer and an SiO$_2$ layer formed on said silicon nitride layer by thermal oxidation of the surface of said silicon nitride layer.

5. A semiconductor device according to claim 1, wherein said floating gate is made of polysilicon layer; and said composite insulating layer comprises a first SiO$_2$ (silicon dioxide) layer formed by thermal oxidation of said floating gate, a silicon nitride layer formed on said first SiO$_2$ layer, and a second SiO$_2$ layer formed on said silicon nitride layer by a chemical vapor deposition method.

6. A semiconductor device according to claim 1, wherein the end portions of said composite insulating layer also extend in the channel-width direction of said channel region beyond the end portions of said floating gate.

7. A semiconductor device comprising: source and drain regions between which a channel region is formed, a gate insulating layer provided on said channel region, a floating gate provided on said gate insulating layer, a composite insulating layer provided on said floating gate and including a plurality of insulating layers which are different from one another in their properties, and a control gate provided on said composite insulating layer, wherein said floating gate, said control gate, and said composite insulating layer are self-aligned by anisotropic etching using a single resist pattern, wherein the widths of said floating and said control gates are substantially the same in the length direction of said channel region, and wherein the end portions of said composite insulating layer extend in the length direction of said channel region beyond the end portions of said floating and control gates.

* * * * *